United States Patent
Croke, III et al.

(10) Patent No.: US 7,462,859 B2
(45) Date of Patent: Dec. 9, 2008

(54) QUANTUM WELL DESIGN FOR A COHERENT, SINGLE-PHOTON DETECTOR WITH SPIN RESONANT TRANSISTOR

(75) Inventors: Edward T. Croke, III, Thousand Oaks, CA (US); Mark F. Gyure, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 11/542,322

(22) Filed: Oct. 2, 2006

(65) Prior Publication Data

US 2008/0078989 A1    Apr. 3, 2008

(51) Int. Cl.
*H01L 29/06* (2006.01)
(52) U.S. Cl. .................... 257/21; 257/15; 257/16; 257/17; 257/18; 257/20; 257/E33.008
(58) Field of Classification Search ........... 257/15–21, 257/E33.008
See application file for complete search history.

(56) References Cited

U.S. PATENT DOCUMENTS

| 5,790,583 | A | 8/1998 | Ho | |
|---|---|---|---|---|
| 6,614,086 | B2 * | 9/2003 | Kim et al. | 257/438 |
| 6,720,589 | B1 * | 4/2004 | Shields | 257/194 |
| 2004/0202009 | A1 * | 10/2004 | Chen | 362/561 |
| 2005/0061986 | A1 | 3/2005 | Kardynal | |

FOREIGN PATENT DOCUMENTS

WO    WO2006000646    * 1/2006

OTHER PUBLICATIONS

Kiselev, et al., "Designing a heterostructure for the quantum receiver" Applied Physics Letters. vol. 80, No. 16, p. 2857-2859, Apr. 22, 2002.*

Buller et al., "Time-Resolved Photoluminescence Measurements in InGaAs/InP Multiple-Quantum-Well Structures at 1.3-m Wavelengths by Use of Germanium Single-Photon Avalanche Photodiodes", Applied Optics, vol. 35 No. 6, (1996).*

(Continued)

*Primary Examiner*—Sue A Purvis
*Assistant Examiner*—Jami M Valentine
(74) *Attorney, Agent, or Firm*—Ladas & Parry

(57) ABSTRACT

A spin coherent, single photon detector has a body of semiconductor material with a quantum well region formed in barrier material in the body. The body has a first electrode forming an isolation electrode for defining, when negatively energized, an extent of the quantum well in the body and a second electrode positioned above a location where an electrostatic quantum dot is defined in said quantum well when positively energized. The quantum well occurs in three layers of material: a central quantum well layer and two outer quantum well layers, the two outer quantum well layers having a relatively low conduction band minimum and the barrier having a relatively high conduction band minimum while the central quantum well layer having a conduction band minimum between the relatively high and relatively low conduction band minimums.

18 Claims, 3 Drawing Sheets

Spin-Coherent, Single Photon Detector

OTHER PUBLICATIONS

Vrijen et al., "A spin-coherent semiconductor photo-detector for quantum communication" Physica E., vol. 10, p. 569 (2001).*

Croke, et al., "Direct electrical measurement of the electron g factor in ultra-thin InGaAs/InP single quantum wells", Microelectronics Journal, vol. 36, Issues 3-6, Mar.-Jun. 2005, pp. 379-382.*

Kiselev, A.A., et al., "Designing a Hetereostructure for the quantum receiver," Applied Physics Letters, vol. 80, No. 16 (Apr. 22, 2002).

Vrijen. R., et al., "A spin-coherent semiconductor photo-detector for quantum communication," Physica E., vol. 10, p. 569 (2001).

* cited by examiner

Material A: $g > 0$, $E_c$ highest
Material B: $g < 0$, $E_c$ lowest
Material C: $g > 0$, $E_c$ middle

Spin-Coherent, Single Photon Detector

QUANTUM WELL DESIGN FOR A COHERENT, SINGLE-PHOTON DETECTOR WITH SPIN RESONANT TRANSISTOR

STATEMENT REGARDING FEDERALLY SPONSORED RESEARCH OR DEVELOPMENT

The present invention was made with support from the United States Government under Contract No. DAAD19-01-C-0077 for a Scalable Quantum Information Processing and Applications awarded by the Army Research Office and the Defense Advanced Research Projects Agency (DARPA). The U.S. Government has certain rights in the invention.

TECHNICAL FIELD

This invention relates to the design of a spin-coherent, single-photon detector and a spin-resonant transistor, devices that will allow the next generation of quantum computers to talk to each other using fiber-optic light beams.

BACKGROUND INFORMATION

A single-photon detector absorbs photons (particles of light), while faithfully transmitting quantum information onto individual, spinning electrons. In order for this data transfer to be efficient, electrons in the devices must reside within a thin layer referred to as a quantum well and have the property that, in a magnetic field, the energy for "spin-up" and "spin-down" electrons are equal. Through a process known as g-factor engineering, it is well-known that the magnetically-induced energy difference between "spin-up" and "spin-down" electrons can be controlled by varying the composition and thickness of the quantum well and the surrounding material (the barrier). For additional information see Kiselev, Kim and Yablonovitch "Designing a heterostructure for the quantum receiver" *Applied Physics Ltrs*. vol. 80, num. 16, pg. 2857-2859, 22 Apr. 2002, which is hereby incorporated herein by reference.

A prior art spin-coherent, single-photon detector is described in some detail already in R. Vrijen and E. Yablonovitch, "A spin-coherent semiconductor photo-detector for quantum communication" Physica E., vol. 10, pg. 569 (2001), which is hereby incorporated herein by reference.

The present disclosure suggests an improvement, namely, adding a third material, located within the quantum well itself, which should relax certain constraints on the design of so-called zero g-factor devices. The new material should possess a different g-factor and a different band alignment than the quantum well material and typically also different than the barrier material.

The addition of a third material to the design of zero g-factor devices is expected to provide the following advantages:

1. The quantum well should be less susceptible to fluctuations in its thickness because the presence of the third material within the well will allow it to be much thicker.

2. The spin-resonant transistor is a device for which the individual electrons are held in position by applying a positive voltage to a gate electrode. In some situations, it is desirable to modulate the g-factor by varying the bias on the gate electrode. The new quantum well disclosed herein will allow for the g-factor of the trapped electrons to be more sensitive to applied gate bias and therefore, will require less modulation to change the g-factor by a given amount. This is an advantage because too large a change in gate bias can either cause a trapped electron to leave or attract a second electron to enter the device. Both of these alternatives can be detrimental to the performance of the device.

3. The new quantum well is more flexible with respect to engineering tradeoffs between well thickness, g-factor, and band gap energies of the well and barrier materials. The added flexibility in the design makes the devices more easily compatible with commercial, networking technologies.

The term "zero g-factor devices" embraces, of course, devices which have a zero effective, weighted g-factor. But since devices whose effective, weighted g-factor is dose to zero are also satisfactory, one issue becomes how dose to zero is close enough? For a spin-coherent detector to work properly, the device is put in a magnetic field, which results in an energy difference between "spin-up" and "spin-down" electrons. This energy difference (referred to a the Zeeman energy) is directly proportional to both the strength of the aforementioned magnetic field and the g-factor. The choice of the magnetic field can vary significantly. The g-factor must be close enough to zero to make the Zeeman energy less than a linewidth (expressed in terms of energy) of the photons to be detected.

The disclosed technology is expected to be important to the development of novel, quantum information processing devices. Such devices will have applications in secure communications and quantum computing, currently active areas of research funded by the US Government (notably DARPA and ARDA).

The prior art is described in the aforementioned paper by Kiselev et al. (Applied Physics Letters, v. 80, p. 2857 (2002)) in which the authors thereof discuss how to design a heterostructure to achieve zero g-factor in a quantum receiver application. The results show that by varying the quantum well thickness and Ga concentration, for an InGaAs quantum well in InP, the g-factor can be tuned from large and negative, to somewhat positive. For a g-factor dose to zero, however, the thickness of the quantum well becomes very small and the Ga composition becomes large, resulting in films that are highly strained and metastable. In addition, single monolayer fluctuations in quantum well thickness can cause large variations (percentagewise) in the performance of these devices.

Modifying the structure of a quantum well to change its properties is not a new idea; however, this is believed to be the first time that anyone has applied these concepts to g-factor engineering. We have experimented with very thin InGaAs quantum wells in InP at HRL Laboratories LLC in Malibu, Calif., and know from experience that electrons within these layers are extremely difficult to control. The advantages of using a different material for the barrier and a third material within the well became clear to us during the course of our experimental work.

BRIEF DESCRIPTION OF THE INVENTION

In one aspect the present invention provides a spin coherent, single photon detector comprising a body of semiconductor material having a quantum well region formed in barrier material in said body, said body having first and second electrodes formed thereon, the first electrode forming an isolation electrode for defining, when negatively energized, an extent of the quantum well in said body and the second electrode being positioned above a location where an electrostatic quantum dot is defined in said quantum well in response to positive energization of said second electrode, the quantum well being defined by at least three layers of material, a central quantum well layer and two outer layers, the two outer layers of the quantum well having a relatively low conduction band minimum and the barrier having a relatively high conduction band minimum while the central quantum well layer having a conduction band minimum between the relatively high and relatively low conduction band minimums, and wherein an effective, weighted g-factor for the detector is sufficiently close to zero that the Zeeman energy is less than a linewidth, expressed in terms of energy, of photons to be detected by the detector.

In another aspect the present invention provides spin coherent, single photon detector comprising a body of semiconductor material having a quantum well region formed in barrier material comprising AlInAs in said body, said body having first and second electrodes formed thereon, the first electrode forming an isolation electrode for defining, when negatively energized, an extent of the quantum well in said body and the second electrode being positioned above a location where an electrostatic quantum dot is defined in said quantum well in response to positive energization of said second electrode, the quantum well occurring in at least three layers of material: a central quantum well layer comprising InP and two outer layers each comprising InGaAs.

In still yet another aspect the present invention provides a method of reducing the susceptibility of a quantum well to fluctuations in well thickness during manufacture, the method comprising forming a central layer with a quantum well, the central layer being sandwiched between two adjacent layers, the two adjacent layers of the quantum well having a relatively low conduction band minimum and a barrier having a relatively high conduction band minimum while the central layer has a conduction band minimum between the relatively high and relatively low conduction band minimums, and wherein an effective, weighted g-factor for the quantum well is sufficiently close to zero that the Zeeman energy is less than a linewidth, expressed in terms of energy, of photons to be detected by the detector.

DETAILED DESCRIPTION

The present invention involves the use of three semiconductor materials, A, B, and C possessing the following properties. Material A is a quantum well barrier material which preferably has a positive g-factor and also has a relatively high conduction band minimum compared with Materials B and C. Materials B and C define the quantum well. Material B has a negative g-factor and a low conduction band minimum. Material C is preferably disposed in the middle of Material B and has a positive g-factor and a moderate conduction band minimum. In one embodiment Material A preferably comprises AlInAs, Material B preferably comprises InGaAs and Material C preferably comprises InP. Advantageously, these particular materials can be selected so that they are all lattice matched to InP.

Figure 1:
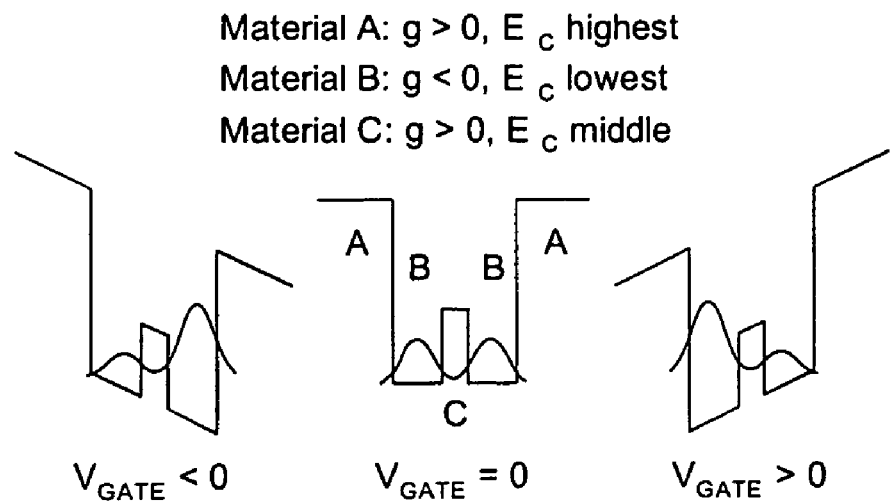
FIGS. 1a, 1b and 1c depict the band structure of a quantum well under different bias conditions. Electrons occupying states in the well can be made to oscillate under an applied bias between two layers composed of Material B. Material C forms a small barrier within the well which helps modulate the effective g-factor.

The situation is depicted schematically in FIGS. 1a, 1b and 1c. In FIG. 1a, a negative gate bias is applied to the quantum well (formed by Materials B and C) causing electrons to be driven away from the gate (to the right in FIG. 1a). This causes the average electron in the well to experience primarily the g-factor associated with material B (there is little penetration of the wavefunction into material A because it has such a high conduction band minimum). Therefore, under high, negative biases, the effective g-factor is negative.

Similarly for high positive biases (see FIG. 1c), the electrons are driven closer to the gate (to the right in FIG. 1c), and the average electron experiences primarily the g-factor of Material B once again. Therefore, the effective g-factor is also expected to be negative for a high, positive gate bias.

At flatband (close to $V_{GATE}=0$) as shown in FIG. 1b, the average electron has a significant likelihood of being in material C and experiencing its positive g-value. For an appropriate choice of materials and thicknesses, the effective g-factor for an electron at or near flatband can be made positive.

Figure 2:
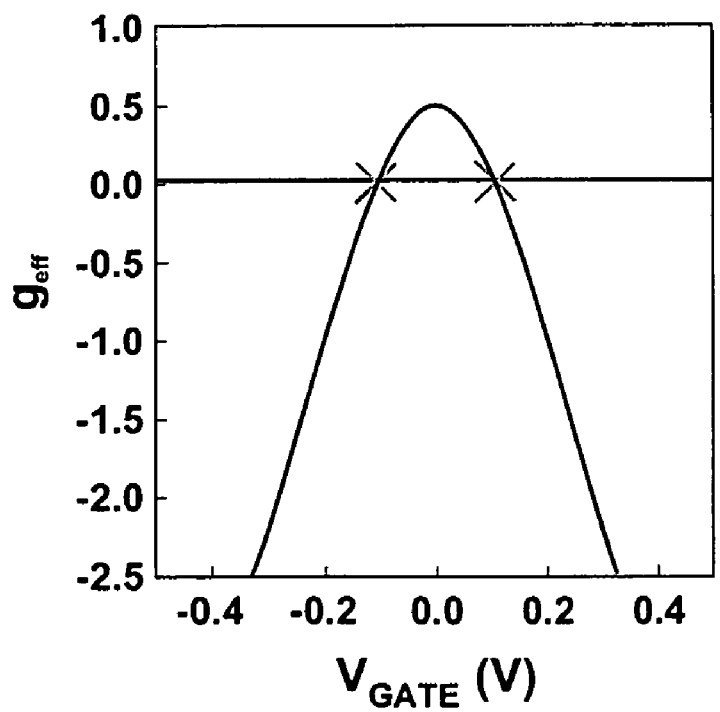
FIG. 2 is a graph of $g_{eff}$ vs the gate voltage ($V_{gate}$). For an appropriate choice of materials and thicknesses, the effective g-factor ($g_{eff}$) of an electron in a quantum well can be made to vary from negative to positive values. In principle, one could design the structure to have two bias points where the g-factor could be equal to zero (see the Xs). The voltage at which the g-value reaches a maximum can also be engineered.

These assertions imply a qualitative behavior of the effective g-factor as a function of applied gate bias similar to what is depicted in FIG. 2. At least 2 bias points should be available for which the effective g-value is equal to zero. The g-factor should also be a strong function of gate bias, particularly near the flat band condition. A great deal of flexibility in the design should enable control over the gate voltage for which the g-factor is a maximum.

The most desirable choices of materials satisfying the conditions detailed above is AlInAs for material A, InGaAs for material B, and InP for material C, as indicated above. One can also use compositions for the AlInAs and InGaAs so that these materials can be grown strain-free on an InP semi-insulating substrate.

Figure 3:
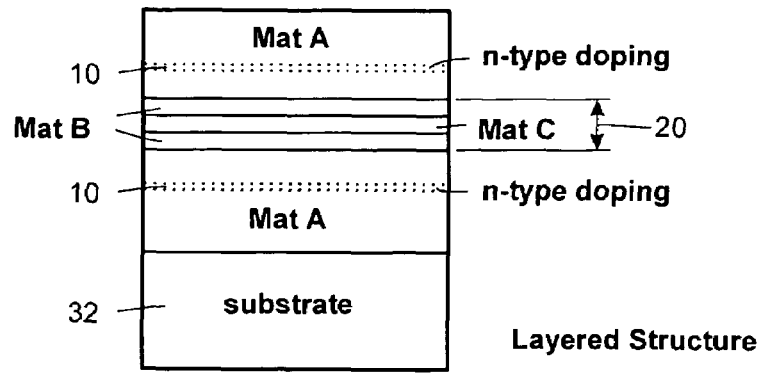
FIG. 3 is a side elevation view of the layer structure of a quantum well in accordance with the present disclosure.

FIG. 3 is side elevation view of the layer structure of a quantum well formed by materials A, B and C. The device disclosed herein is preferably fabricated on a semiconducting heterostructure consisting of a quantum well (Materials B and C) and surrounding barrier material (Material A), with doped n-type material in thin layers possibly both above and below the quantum well (see FIG. 3). The doped layers 10 may have a thickness of about 10 nm and doping concentrations in the range of $1 \times 10^{16}$ to $1 \times 10^{18}$ cm$^{-3}$. The figures show the doped layers 10 and the quantum well 20, itself comprised of three layers containing materials B and C. The best values to use for the doping concentrations in the layers 10 above and below the quantum well 20, and the composition and thickness of the layers of materials B and C in the quantum well are not known. The thickness of the three layer stack shown in FIG. 3 can be about 5 to 15 nm. The thickness of the individual layers A, B and C can be allowed to vary, depending on the desired response of the g-factor to applied bias. The barrier layer A may be formed on a substrate 32, which may be formed of the same material as Material C, for example.

Figure 4A:
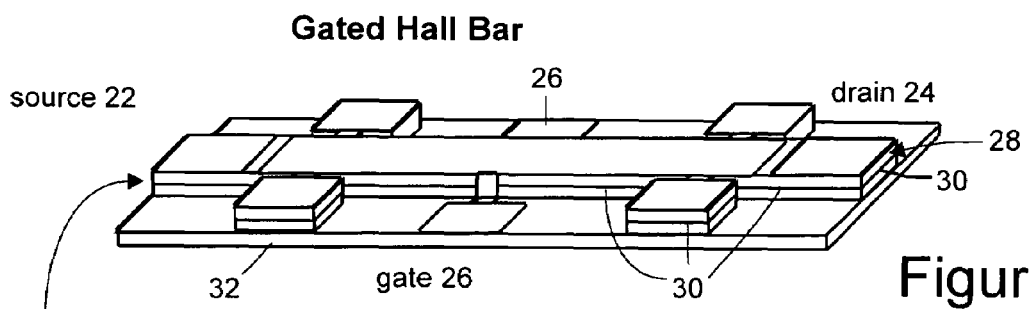
FIGS. 4a and 4b are exploded perspective views showing a gated Hall bar device being used with my improved quantum well, which can be used to help measure the g-factor of different material systems, different geometries and well sizes as well as with different gate voltages applied thereto.
Figure 4B:
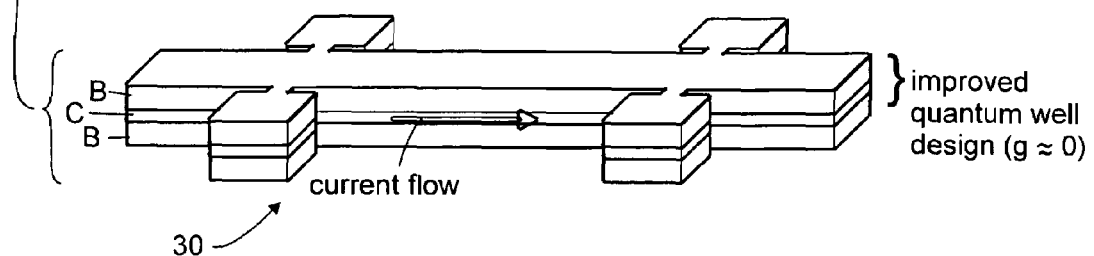

FIGS. 1a-1c and 2 depict a possible response of the quantum well band structure (and the wavefunction associated with a trapped electron within the quantum well) to applied bias for a device geometry referred to as a gated Hall bar. A drawing of a gated Hall bar, with the added layer of material C in the quantum well, is shown in FIGS. 4a and 4b. Such a device is not a spin-coherent, single photon detector but rather, a useful diagnostic tool to understand how the g-factor varies under an applied bias. Experiments are currently underway at HRL Laboratories on devices like this to gather data on the bias dependence of the g-factor for InGaAs quantum wells in InP. The data allows one to refine 3-D models of the electrostatics of such and similar device geometries including more complex gate arrangements.

FIG. 4a and 4b are exploded, perspective views of the Hall bar with the added layer of material C in the quantum well. FIG. 4a shows the Hall bar with metal electrode structure thereon, including a source 22, drain 24 and a pair of gates 26. The metal electrode structure is disposed on or over a semiconductor mesa 28 and the quantum well is formed as thin layer 30 within the mesa 28. The quantum well layer 30 is bounded on its top and bottom sides by Material A previously described with reference to FIGS. 1a, 1b, 1c, 2 and 3. The mesa 28 is preferably disposed on substrate 32 and preferably contains layers of Material A, B and C. The magnetic field is also depicted. FIG. 4b shows the quantum well 30 in greater detail which is formed of layers of Material B on either side of a central layer of Material C.

The quantum well 30 is preferably designed so that the effective overall g-factor (with the gate voltage applied to gate 26) weighted by the electron probably factor that an electron will be in a given layer is approximately equal to zero (as defined above and mentioned below). The gated Hall bar of FIGS. 4a and 4b help one to determine what the effective g factor is for various possible quantum well sizes, materials and applied gate biases.

As indicated above, if AlInAs is used for material A, and InGaAs is used for Material B and InP is used for Material C, these material choices allow for the effective weighted g factor for the device to be approximately zero. Furthermore, if both AlInAs and InGaAs are grown lattice-matched (i.e. strain-free) on InP for $x_{Ga}$=0.47 (Ga fraction in InGaAs) and $x_{Al}$=0.48 (Al fraction in AlInAs), a strain-free device will result, which has certain advantages. Some very small amount of strain in a heterostructure will not hurt it, but increasing the strain leads to defect formation and performance degradation. These problems become more extreme should high process temperatures be required during device fabrication. So it is best practice to reduce the strain and it can be eliminated altogether using the preferred materials for Materials A, B and C and by adjusting their constituent concentrations so that these materials have the same crystalline lattice constants.

Figure 5A:
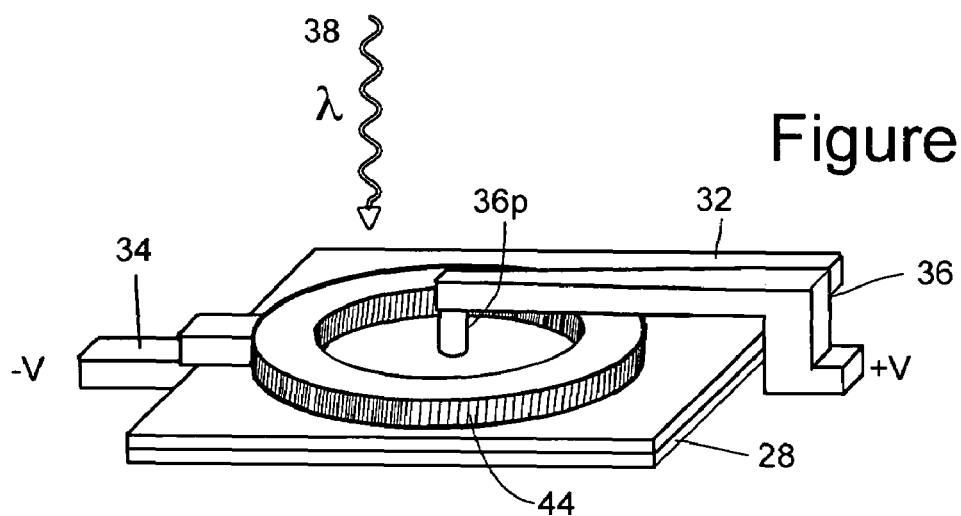
FIGS. 5a and 5b are exploded perspective views showing a spin-coherent, single photon detector in accordance with the present disclosure.
Figure 5B:
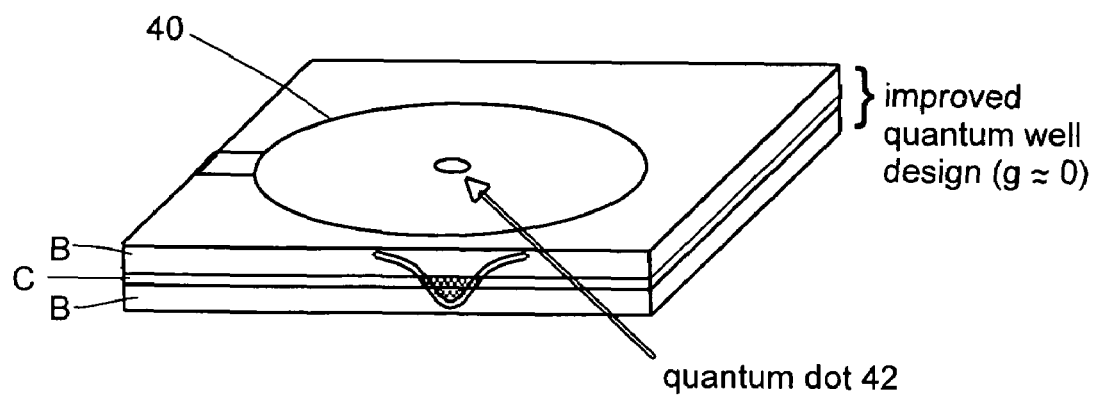

One possible embodiment of a spin-coherent, single photon detector is shown in FIGS. 5a and 5b. For a negative bias applied to the circular gate electrode 34 and a positive bias applied to the air-bridged gate electrode 36, one can create a situation for which an incident light particle (a photon) 38 can create an electron-hole pair in the quantum well 40. These voltages would typically be less that a few volts. In FIG. 5a, the circular gate electrode 34 defines the area or region within which an absorbed photon can be detected. The quantum well layer 30 is quantized in the direction normal to the plane of the ring of the circular gate electrode 34 by selecting its thickness (the thickness of materials B and C) sufficiently thin that quantization of energy levels come into play, as is well known in the art. The quantum well layer 30 is sandwiched between layers of Material A in the mesa 28 on which gate 34 is formed and is preferably formed of three layers, two layers of Material B with a single thin layer of Material C centered therein as shown by FIG. 5b. Because the quantum well 40 is designed to have an effective, weighted g factor≈0 for electrons, quantum information stored in photon polarization states can be faithfully transmitted into electron spin states (see Vrijen et al., Physica E, vol. 10, pg. 569 (2001), mentioned above). The electron is then allowed to drift to the electrostatic quantum dot 42 formed at the center of the quantum well 40 and detected by the spin-resonant transistor thereat.

As indicated above, for a spin-coherent detector to work properly, the device is put in a magnetic field, which results in an energy difference between "spin-up" and "spin-down" electrons. This energy difference (referred to the Zeeman energy) is directly proportional to both the strength of the aforementioned magnetic field and the g-factor. The choice of the magnetic field can vary significantly. Preferably, its direction occurs in a plane parallel to the major planes of layers B, C, B, as shown. But its direction can be varied, although a magnetic field which is perpendicular to the major planes of layers B, C, B would typically be the least desirable choice. The g-factor must be close enough to zero (g factor≈0) to make the Zeeman energy less than a linewidth (expressed in terms of energy) of the photons to be detected.

The basic concept of a spin-coherent, single-photon detector is described in some detail already in Vrijen's 2001 paper mentioned above, but as already indicated this disclosure takes that prior art further by incorporating layer Material C into the quantum well, thereby producing advantage(s) discussed above. The circular region defined by the isolation gate 34 can be made as large as about 1 μm in diameter and still allow the electron (from the electron-hole pair formed by the detected photon) to drift to the quantum dot 42 in a reasonable amount of time (<1 μs). As is shown in FIGS. 5a and 5b, the spin-resonant transistor gate spans several μm. A tiny post 36p, which may be 5-10 nm in diameter, associated with gate electrode 36, is located in the interior of the isolation gate 34 and usually also in the center of the device (however, it need not be located precisely at the center of the device). The spin-resonant transistor gate, centered on the post 36p, continues to a point outside of a mesa 28 which is preferably etched in the heterostructure. Finally, the quantum dot 42 is located several tens of nm below the spin-resonant transistor gate post 36p.

As previously indicated Materials A, B and C should preferably exhibit the following relationships:

|  | Material A | Material B | Material C |
|---|---|---|---|
| bulk g factor | >0 | <0 | >0 |
| $E_c$ | highest | lowest | middle |

As indicated above, the overall weighted (by the electron probability factor) g factor should be at or close to zero. The probability of finding an electron in Materials A, B and C will depend somewhat on their conduction band minimums ($E_c$). So it could be in certain embodiments that the effective g factor for the barrier material A could be zero or somewhat negative, if its influence is not great upon the overall weighted g factor (which can occur when it has a large $E_c$ compared to the $E_c$ of Material B, giving it a low weighting factor).

A small electrostatic gate 36p applied to the surface of structures can produce quantum dots 42 under an applied positive bias. The electrons trapped in quantum dots 42 formed in the layered structures of Materials B and C discussed here would make excellent candidates for electron spin qubits. Quantum dot devices such as these can be designed to work alternatively as spin-resonant transistors.

These devices ultimately have applications in quantum information processors such as the quantum repeater or in a quantum computer.

Having described the invention in connection with a preferred embodiment, modification will now suggest itself to those skilled in the art. For example, so practicing the present invention might consider adding a backside gate in order to control the carrier density in the quantum well 42. As such the invention is not to be limited to this preferred embodiment except as specifically required by the appended claims.

What is claimed is:

1. A photon detector comprising a body of semiconductor material having a quantum well region disposed in barrier material in said body, said body having first and second electrodes formed thereon, the first electrode forming an isolation electrode for defining, when negatively energized, an extent of a quantum well in said body and the second electrode being positioned above a location where an electrostatic quantum dot is defined in said quantum well in response to positive energization of said second electrode, the quantum well occurring in a quantum well region defined by at least three layers of material including: (i) a central layer at least partially disposed within the quantum well, and (ii) two outer layers also at least partially disposed within the quantum well, the two outer layers of the quantum well region having a relatively low conduction band minimum compared the barrier material which has a relatively high conduction band minimum, the central layer having a conduction band minimum between the relatively high conduction band minimum of the barrier material and relatively low conduction band minimum of the two outer layers, and wherein an effective, weighted g-factor for the detector is sufficiently close to zero that the Zeeman energy is less than a linewidth, expressed in terms of energy, of photons to be detected by the detector, the central layer and the two outer layers being sufficiently thin that only a single, common quantum well occurs with respect to said quantum dot.

2. The photon detector of claim 1 wherein said central layer comprises InP and two outer layers comprise InGaAs.

3. The photon detector of claim 2 wherein the outer layers of InGaAs are lattice-matched to InP.

4. The photon detector of claim 1 wherein the barrier material comprises AlInAs.

5. The photon detector of claim 4 wherein the barrier material AlInAs is lattice-matched to InP.

6. The photon detector of claim 1 wherein the barrier material is disposed on a substrate of InP, the barrier material is AlInAs lattice-matched to InP and the outer layers are InGaAs lattice-matched to InP.

7. The photon detector of claim 1 wherein the first electrode has a circular configuration.

8. The photon detector of claim 1 wherein the first electrode has an annular configuration.

9. The photon detector of claim 1 wherein the outer layers are disposed immediately adjacent and in contact with said central layer.

10. A photon detector comprising a body of semiconductor material having a quantum well region formed in barrier material comprising AlInAs in said body, said body having first and second electrodes formed thereon, the first electrode forming an isolation electrode for defining, when negatively energized, an extent of a quantum well in said body and the second electrode being positioned above a location where an electrostatic quantum dot occurs in said quantum well region in response to positive energization of said second electrode, the quantum well region including in at least three layers of material comprising a central layer formed of InP and two outer layers each formed of InGaAs.

11. The photon detector of claim 10 wherein the barrier material is disposed on a substrate of InP.

12. The photon detector of claim 10 wherein the outermost layers of InGaAs are lattice-matched to InP.

13. The photon detector of claim 12 wherein the barrier material AlInAs is also lattice-matched in InP.

14. The photon detector of claim 10 wherein the first electrode has a circular configuration.

15. A method of using the photon detector of claim 10 wherein, in use, a voltage greater than minus five volts, but less than zero volts, is impressed on said first electrode.

16. The photon detector of claim 10 wherein the outer layers are disposed immediately adjacent and in contact with said central layer.

17. A method of detecting a single photon in a spin coherent manner, the method comprising the steps of:
    forming a body of semiconductor material having a quantum well region disposed in barrier material in said body, the quantum well occurring in a quantum well region defined by at least three layers of material including: (i) a central layer at least partially disposed within the quantum well region, and (ii) two outer layers also at least partially disposed within the quantum well region, the two outer layers of the quantum well region having a relatively low conduction band minimum compared the barrier material which has a relatively high conduction band minimum, the central layer having a conduction band minimum between the relatively high conduction band minimum of the barrier material and relatively low conduction band minimum of the two outer layers, and wherein an effective, weighted g-factor for the detector is sufficiently close to zero that the Zeeman energy is less than a linewidth, expressed in terms of energy, of photons to be detected by the detector;
    forming a quantum well and electrostatic quantum dot in said quantum well region, wherein the central layer and the two outer layers in the quantum well region being sufficiently thin that such that said quantum well occurs as a single, common quantum well in said quantum well region whereby an incident photon creates an electron-hole pair in said single, common quantum well; and
    applying a magnetic field to said quantum well region such that the incident photon creates said electron with spin coherency.

18. The photon detector of claim 1 wherein the photon detector exhibits spin coherency in detection of a single photon when a magnetic field is applied to said quantum well region such that the single photon creates an electron of an electron-hole pair with spin coherency in said magnetic field.

* * * * *